United States Patent [19]

Chen et al.

[11] Patent Number: 4,689,494
[45] Date of Patent: Aug. 25, 1987

[54] REDUNDANCY ENABLE/DISABLE CIRCUIT

[75] Inventors: Cheng-Wei Chen, Santa Clara; Jieh-Ping Peng, Milpitas, both of Calif.

[73] Assignee: Advanced Micro Devices, Inc., Sunnyvale, Calif.

[21] Appl. No.: 908,839

[22] Filed: Sep. 18, 1986

[51] Int. Cl.⁴ .................. H03K 19/003; H03K 19/094
[52] U.S. Cl. .................................. 307/202.1; 307/441; 307/449; 307/451; 307/469; 307/219; 365/200
[58] Field of Search ............... 307/200 B, 202.1, 441, 307/443, 446, 448, 449, 451, 465, 468, 469, 219, 567–568, 584–585; 365/96, 200

[56] References Cited

U.S. PATENT DOCUMENTS

| | | | |
|---|---|---|---|
| 4,399,372 | 8/1983 | Tanimoto et al. | 307/449 X |
| 4,476,546 | 10/1984 | Varshney | 365/200 |
| 4,592,025 | 5/1986 | Takemae et al. | 365/200 |
| 4,613,959 | 9/1986 | Jiang | 307/219 X |
| 4,614,881 | 9/1986 | Yoshida et al. | 307/219 |
| 4,621,346 | 11/1986 | McAdams | 307/469 X |
| 4,639,895 | 1/1987 | Iwahashi et al. | 365/200 |
| 4,648,075 | 3/1987 | Segawa et al. | 365/200 |
| 4,651,030 | 3/1987 | Mimoto | 307/449 |

OTHER PUBLICATIONS

Taylor et al, "A 1-Mbit CMOS DRAM with a Divided Bitline Matrix Architecture", IEEE JSSC, vol. SC-20, No. 5, Oct. 1985, pp. 894-902.
Fitzgerald et al, "Semiconductor Memory Redundancy at the Module Level", IBM T.D.B., vol. 23, No. 8, Jan. 1981, pp. 3601-3602.
Abbott et al, "Equipping a Line of Memories with Spare Cells", Electronics, Jul. 1981, pp. 127-130.

Primary Examiner—Stanley D. Miller
Assistant Examiner—D. R. Hudspeth
Attorney, Agent, or Firm—Patrick T. King; Davis Chin

[57] ABSTRACT

A redundancy enable/disable circuit for enabling and disabling subsequently the use of redundant elements includes first through third P-channel MOS transistors, an N-channel MOS transistor, an enable fuse, and a disable fuse. The enable fuse is blown so as to enable the use of the redundant elements, and the disable fuse is blown subsequently to disable use of the redundant elements.

14 Claims, 10 Drawing Figures

REDUNDANCY ENABLE/DISABLE CIRCUIT

BACKGROUND OF THE INVENTION

This invention relates generally to logic or memory circuits for producing a redundancy and more particularly, it relates to a redundancy enable/disable circuit having two programmable fuses for substituting spare rows or columns of memory elements in a memory array in place of faulty rows or columns which is formed with a reduced number of circuit components than those traditionally available.

As is generally known, semiconductor memories are manufactured in the form of a memory array of elements which is accessed by a row decoder and a column decoder in order to address a particular memory element or a row of memory elements in the memory array. A sense amplifier formed on the semiconductor chip is used to sense the memory state of the selected memory element when addressed by the row decoder and column decoder. In recent years, there has arisen the need of manufacturing semiconductor memories in which the memory array of elements have a very high density, i.e., 64,000 memory elements or higher. As the density of the memory array on a semiconductor chip increase, it becomes a significantly more difficult task to produce perfect semiconductor memory chips. In an effort to improve production yields and memory chip reliability, redundant memory elements or bits in the form of additional rows or columns in the memory array have been included on the semiconductor chip. The semiconductor memory may be checked when it is in a semiconductor wafer form joined to other semiconductor memory chips to determine whether it operates properly. If a faulty area is located, extra memory circuits can then be substituted for the defective elements in this faulty area on the primary memory array of memory elements.

Heretofore, there are many known existing circuits which implement the substitution of memory elements in a memory array so as to perform the necessary repairs of the faulty memory elements. These prior art circuits require the use of a high number of circuit components and have a relatively complex arrangement utilizing inverters and/or pass gates. As a result, these circuits suffer from the disadvantage of high power consumption. Further, the prior art circuits have the additional disadvantage of requiring use of a large amount of semiconductor chip area. There are shown in FIGS. 1(a) and 1(b) examples of conventional circuits 2 and 4, respectively, for producing redundancy and have been labeled with the designation "Prior Art."

It would therefore be desirable to provide a redundancy enable/disable circuit which advantageously increases the economy of manufacturing of such circuits and which decreases the amount of chip area required. It would also be expedient to provide a redundancy enable/disable circuit which utilizes a smaller number of circuit components than conventionally built circuits for producing a redundancy. In a first embodiment of the present invention, there is provided a redundancy enable/disable circuit having two programmable fuses which utilizes a relatively few number of components and consumes no DC current so as to reduce power consumption. In a second embodiment, there is provided a redundancy enable/disable circuit which is formed with even yet a smaller number of circuit components than the first embodiment, but does consume a small amount of DC current. The embodiments of the present invention are implemented without requiring the use of inverters, does not involve a complicated timing scheme, and is fabricated with a compact design layout.

SUMMARY OF THE INVENTION

Accordingly, it is a general object of the present invention to provide a redundancy enable/disable circuit for enabling and disabling subsequently the use of redundant elements which is relatively simple and economical to manufacture and assemble, but yet overcomes the disadvantages of the prior art circuits.

It is an object of the present invention to provide a redundancy enable/disable circuit for enabling and disabling subsequently the use of redundant elements which is formed with a reduced number of circuit components than those traditionally available.

It is still another object of the present invention to provide a redundancy enable/disable circuit for enabling and disabling subsequently the use of redundant elements which is formed without the use of inverters and does not involve a complicated timing scheme.

It is still another object of the present invention to provide a redundancy enable/disable circuit for enabling and disabling subsequently the use of redundant elements which is fabricated with a compact design layout.

It is still yet another object of the present invention to provide a redundancy enable/disable circuit which includes first through third P-channel MOS transistors, an N-channel MOS transistor, an enable fuse, and a disable fuse.

In accordance with these aims and objectives, the present invention is concerned with the provision of redundancy enable/disable circuit for enabling and disabling subsequently the use of redundant elements which includes a first P-channel MOS transistor, a second P-channel MOS transistor, a third P-channel MOS transistor, an N-channel MOS transistor, an enable fuse, and a disable fuse. The first P-channel transistor has its source connected to a supply potential. The second P-channel transistor has its source connected to the drain of the first P-channel transistor, its gate connected to a first input terminal, and its drain connected to an output node. The third P-channel transistor has its source connected to the supply potential, its gate connected to a ground potential, and its drain connected to the gate of the first P-channel transistor. The N-channel transistor has its drain connected to the drain of the second P-channel transistor, its gate connected to the gate of the first P-channel transistor, and its source connected to the ground potential. The enable fuse has a first end connected to the drain of the N-channel transistor and a second end connected to the ground potential. The disable fuse has a first end connected to the gate of the first P-channel transistor and a second end connected to a second input terminal.

In operation, the output node is at a low logic level when the enable and disable fuses are not blown. In this condition, no redundancy is involved. By blowing the enable fuse, the output node is enabled so as to permit use of redundant elements connectible to the output node. By blowing subsequently the disable fuse, the output node is disabled so as to prevent use of the redundant elements. Furthermore, the present invention can be manufactured, programmed and completely tested as a standard, high volume VLSI (very large scale integration) product having the advantages of high speed and low power consumption, and can be tested at the wafer stage or before being packaged so as to overcome faults thereby increasing production yield.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1A:
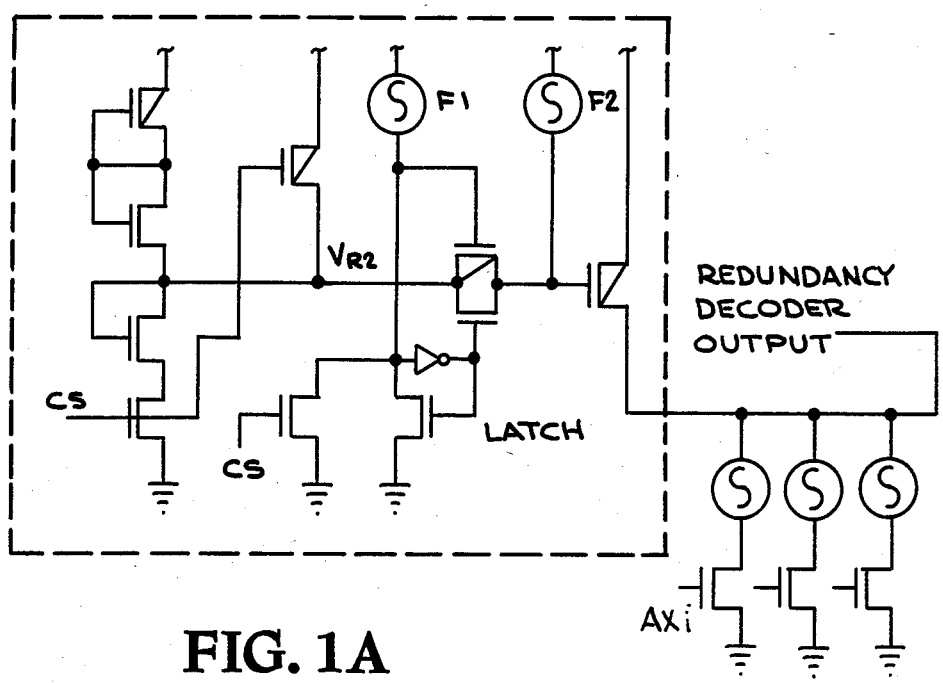
FIGS. 1(a) and 1(b) are schematic circuit diagrams of prior art circuits for producing a redundancy.
Figure 1B:
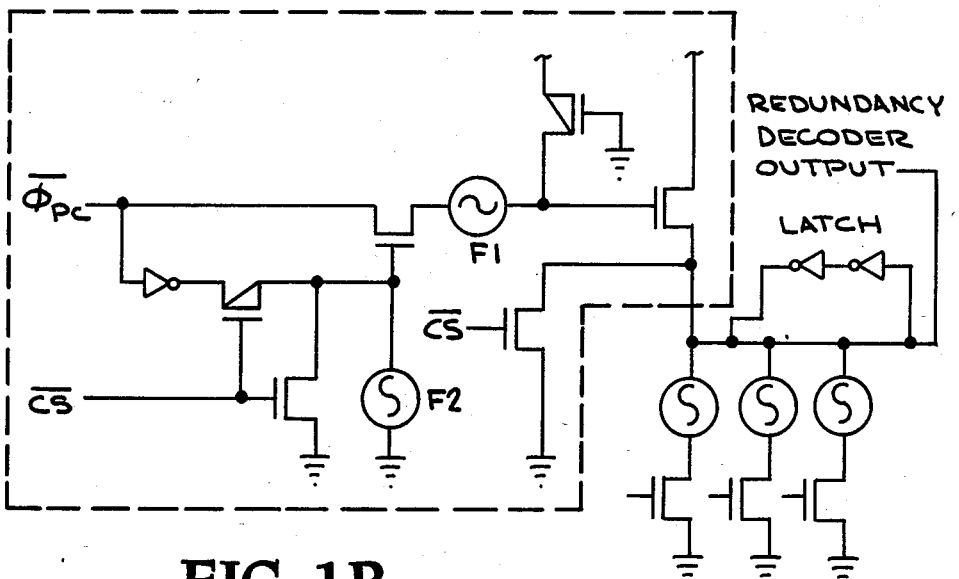
Figure 2:
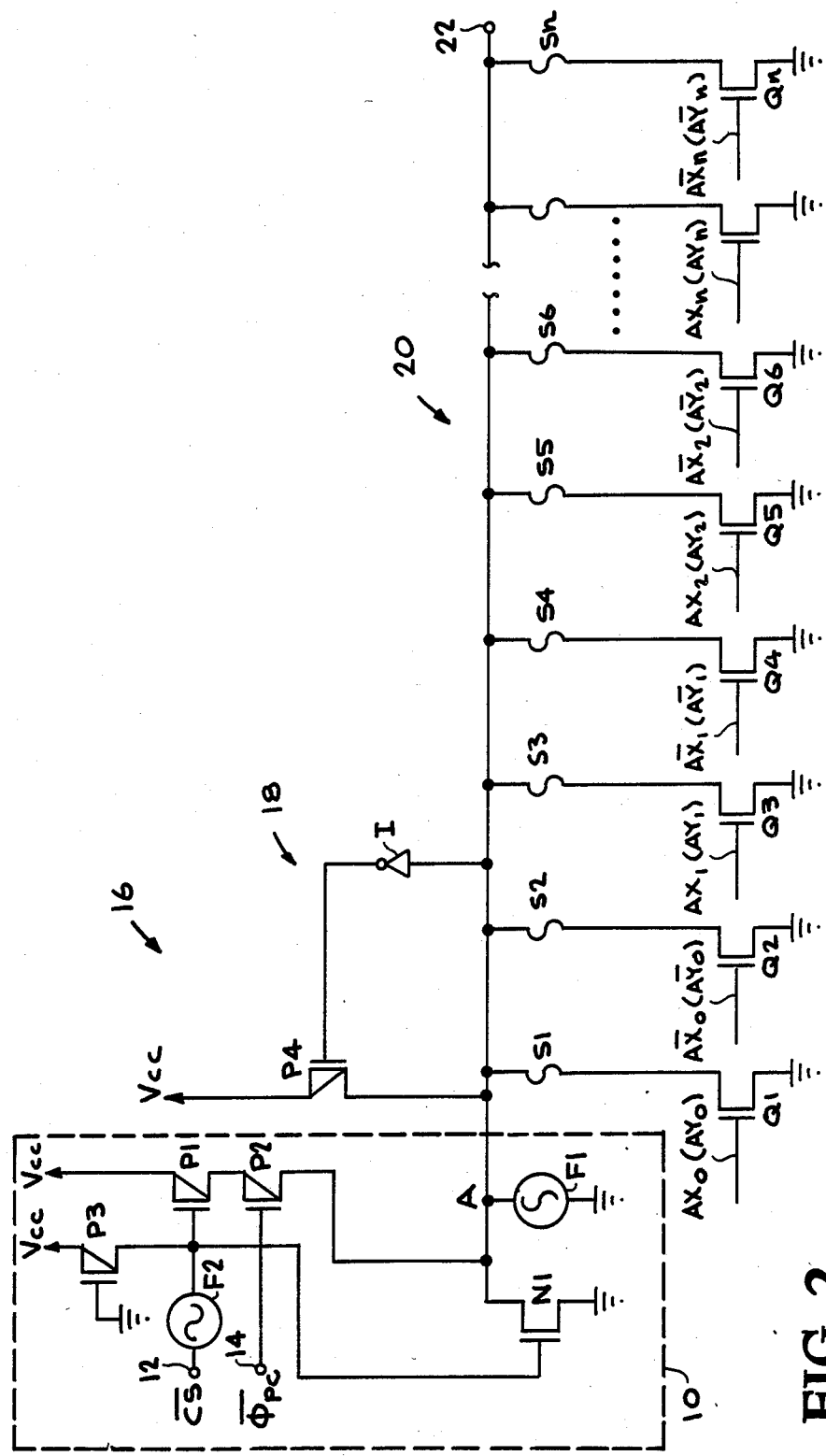
FIG. 2 is a schematic circuit diagram of one embodiment of a redundancy enable/disable circuit of the present invention.

Referring now in detail to the drawings, there is shown in FIG. 2 a schematic circuit diagram of one embodiment of a redundancy enable/disable 10 of the present invention for enabling and disabling subsequently of spare rows or columns of memory elements (not shown) in a memory array. The redundancy enable/disable circuit 10 includes two programmable fuses, a first P-channel MOS transistor P1, a second P-channel MOS transistor P2, a third P-channel MOS transistor P3 and a chip select N-channel MOS transistor N1. The two programmable fuses are formed of an enable fuse F1 and a disable fuse F2. The first and second P-channel transistors P1 and P2 are connected together so as to function as a two-input NOR gate.

The first P-channel transistor P1 has its source connected to a supply voltage or potential VCC which is typically +5.0 volts for MOS circuitry. The first P-channel transistor P1 has its gate connected to one end of the disable fuse F2 and has its drain connected to the source of the second P-channel transistor P2. The other end of the disable fuse F2 is connected to an input terminal 12 which receives a complement of a chip select signal CS. The second P-channel transistor P2 has its gate connected to an input terminal 14 which receives a complement of a precharging pulse signal PC and has its drain connected to the drain of the N-channel transistor N1 and to one end of the enable fuse F1 defining the output of the redundancy enable/disable circuit 10 at node A. The source of the N-channel transistor N1 and the other end of the enable fuse F1 are connected to a ground potential. The gate of the N-channel transistor N1 is connected to the gate of the first P-channel transistor P1 and to the drain of the third P-channel transistor P3. The third P-channel transistor P3 has it source connected to the supply potential VCC and has it gate connected to the ground potential. Thus, the transistor P3 is always rendered to be conductive.

The transistor P3 functions as a pull-up transistor and is sometimes referred to as a leaker transistor. The purpose of the transistor P3 is to maintain the drain thereof (gate of the transistor P1) from being at a floating potential when both of the fuses F1 and F2 are blown or opened. Therefore, the transistor P3 is usually designed to be of a relatively small size. The fuses F1 and F2 may, for example, be metal, silicide, or a semiconductor such as a polysilicon material which may be opened or blown by the use of a laser cut.

As can be seen, the redundancy enable/disable circuit 10 is only a part of a redundancy decoder circuit 16 which also includes a dynamic latch portion 18 and an address buffer portion 20. The dynamic latch portion 18 includes an inverter I and a P-channel MOS transistor P4. The inverter I has its input connected to the drain of the P-channel transistor P4, to the output node A and to an output terminal 22. The transistor P4 has its gate connected to the output of the inverter I and has its source connected to the supply potential VCC. It should be understood that the output terminal 22 provides an output logic signal which is utilized to control an array of spare (redundant) row or column elements connectible to the output terminal 22.

The address buffer portion 20 includes a plurality of N-channel MOS transistors Q1, Q2, ... Qn whose sources are connected to the ground potential. The drains of the transistors Q1, Q2, ... Qn are connected via respective fuses S1, S2, ... Sn to the output terminal 22. True and complement address signals $AX_0$, $A\overline{X}_0$, $AX_1$, $A\overline{X}_1$, ... $AX_n$, $A\overline{X}_n$ for row redundancy or true and complement address signals $Ay_0$, $A\overline{Y}_0$, $AY_1$, $A\overline{Y}_1$, ... $AY_n$, $A\overline{Y}_n$ for column redundancy are applied to the respective gates of the transistors Q1, Q2, ... Qn. Selected ones of the fuses S1, S2, ... Sn associated with each true or complement addresses are blown during programming so as to be responsive to a particular address which is faulty and is to be replaced by the redundant elements. For example, if $AX_0=1$, $AX_1=0$, and $AX_2=1$ is the row address that is faulty, then the fuses S1, S4 and S5 associated with the address signals $AX_0$, $A\overline{X}_1$, and $AX_2$ are the ones required to be blown.

Figure 4A:
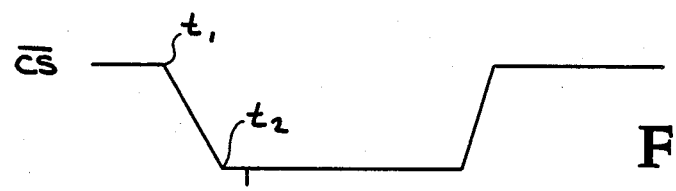
FIGS. 4(a)–4(c) are waveforms useful in understanding the chip select access operation of FIG. 2.
Figure 4B:
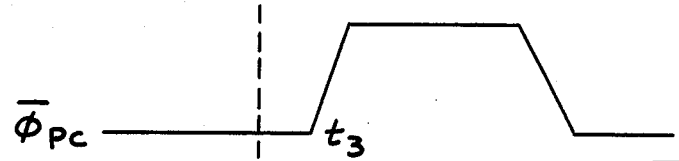
Figure 4C:

For explaining the operation of the redundancy enable/disable circuit of FIG. 2, reference is made to the waveforms shown in FIGS. 4(a) through 4(c). Initially, it will be noted that if a semiconductor memory tested at the wafer stage or before being packaged is found to contain no faulty elements or bits in the rows or columns of the memory array, there will be no need to substitute the primary memory array with spare (redundant) row or column bits. If this is indeed the case, none of the fuses F1, F2 and S1 through Sn will be made to be blown or opened. As a result, the output node A will be held at a low or ground potential by the enable fuse F1 regardless of the input signals $\overline{CS}$ and $\overline{\phi}_{PC}$ applied to the respective input terminals 12 and 14.

In one type of memory access called chip select access, the chip select signal $\overline{CS}$ will be at a logic "1" if a chip is deselected so as to cause the transistor N1 to be rendered conductive. Thus, the output node A will be held at a low potential. When the chip is selected and the address signals match the addresses of the blown fuses S1 through Sn, the select signal $\overline{CS}$ is switched from the logic "1" level to a logic "0" level indicating a read or write operation. While the transistor N1 will now be turned off, the output node A will be latched still at a low potential by the latch formed by the inverter I and the transistor P4. Since the transistor P1 is maintained in the off condition, the input signals will not alter the low potential at the output node A. As a result, the output terminal 22 will be at a low logic level so that the redundancy row (column) elements will not be used.

When the semiconductor memory is tested and a particular row (column) in the primary memory array has been determined to be faulty, it will be necessary to substitute a spare row in place of a faulty row so as to make the semiconductor memory useful. This is achieved by opening or blowing the enable fuse F1 and certain ones of the fuses S1 through Sn by a laser cut. If the address signals do not match the redundant address of the programmed fuses, at least one of the transistors Q1, Q2, . . . Qn will be turned on. This will cause the output node A to be at the ground potential and thus the redundant element will not be selected. For the following discussion, it will be assumed that the redundant address is selected by the address signals.

Referring to FIG. 4(a), the chip select signal $\overline{CS}$ will normally be at a high or "1" logic level such as at time t1. When a read or write operation is to be performed, the chip select signal $\overline{CS}$ will be switched to a low or "0" logic level such as at time t2. This causes the transistor N1 to be turned off and the output node A will be initially at a low potential. The precharging pulse signal $\overline{\phi}_{PC}$ in FIG. 4(b) consists of a delayed pulse which is in response to the chip select signal $\overline{CS}$ switching from the logic "1" level to the logic "0" level. As can been seen at the time t3, the precharging pulse signal $\overline{\phi}_{PC}$ will be switched from a logic "0" to a logic "1" level.

With these two input signals $\overline{CS}$ and $\overline{\phi}_{PC}$ applied to the two input terminals 12 and 14, the output of the redundancy enable/disable circuit 10 at the node A is produced which is shown in FIG. 4(c). It will be noted that only between the times t2 and t3 the transistors P1 and P2 are both turned on so as to pull the potential at the output node A to a high level near the supply potential VCC. The latch portion 18 serves to maintain the output node A at the high level even after the precharging pulse $\overline{\phi}_{PC}$ is gone. Thus, the output terminal 22 will have a high potential so as to permit use of the redundant row (column) elements.

Figure 5A:
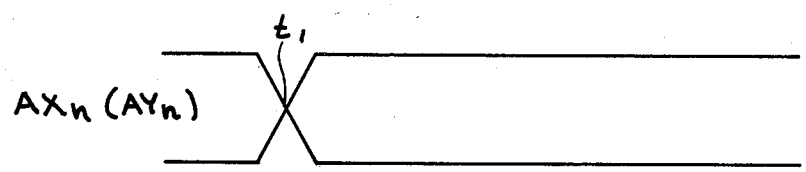
FIGS. 5(a)–5(c) are waveforms useful in understanding the address access operation of FIG. 2.
Figure 5B:
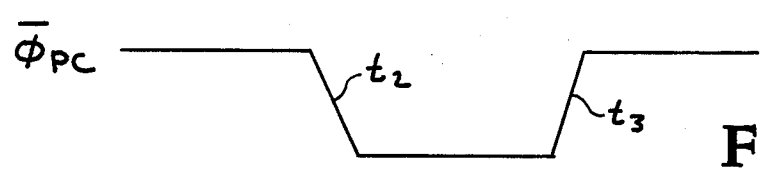
Figure 5C:
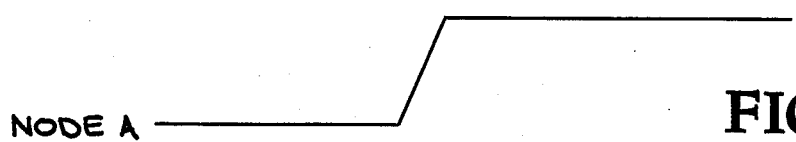

Referring now to FIGS. 5(a)–5(c), there are illustrated waveforms for the operation of another type of memory access called address access. In this address access type, the chip select signal $\overline{CS}$ will always be at a low or "0" logic level. Memory access occurs when either one or multiple address signals are switched such as at the time t1 in FIG. 5(a). This switching is sensed by an address transition detection circuit which generates a precharging pulse signal $\overline{\phi}_{PC}$. As can been seen in FIG. 5(b), the pulse signal $\overline{\phi}_{PC}$ is switched from a logic "1" level to the logic "0" level at the time t2 and is switched back to the logic "1" level at the time t3. With this input signal $\overline{\phi}_{PC}$ applied to the input terminal 14 and the input terminal 12 being held at the logic "0" level, the waveform at the output node A is shown in FIG. 5(c). It will be noted that this waveform in FIG. 5(c) corresponds identically to the waveform in FIG. 4(c). Thus, the pulse signal $\phi_{PC}$ of FIG. 5(b) will trigger the dynamic latch portion 18 in the same way as described previously.

If it is determined subsequently that the spare rows or redundant elements selected for replacing of the faulty elements were not in the proper choice, the selected redundant elements may now be disabled. This is achieved by opening or blowing of the disable fuse F2 by a laser cut. As can be seen from FIG. 2, when the disable fuse F2 is also opened, the output node A will be at a low potential. This is because the pull-up transistor P3 which is always rendered conductive will cause the chip select transistor N1 to be turned on. Therefore, the output terminal 22 will be maintained at a low potential so as to disable the use of the redundant elements.

Figure 3:
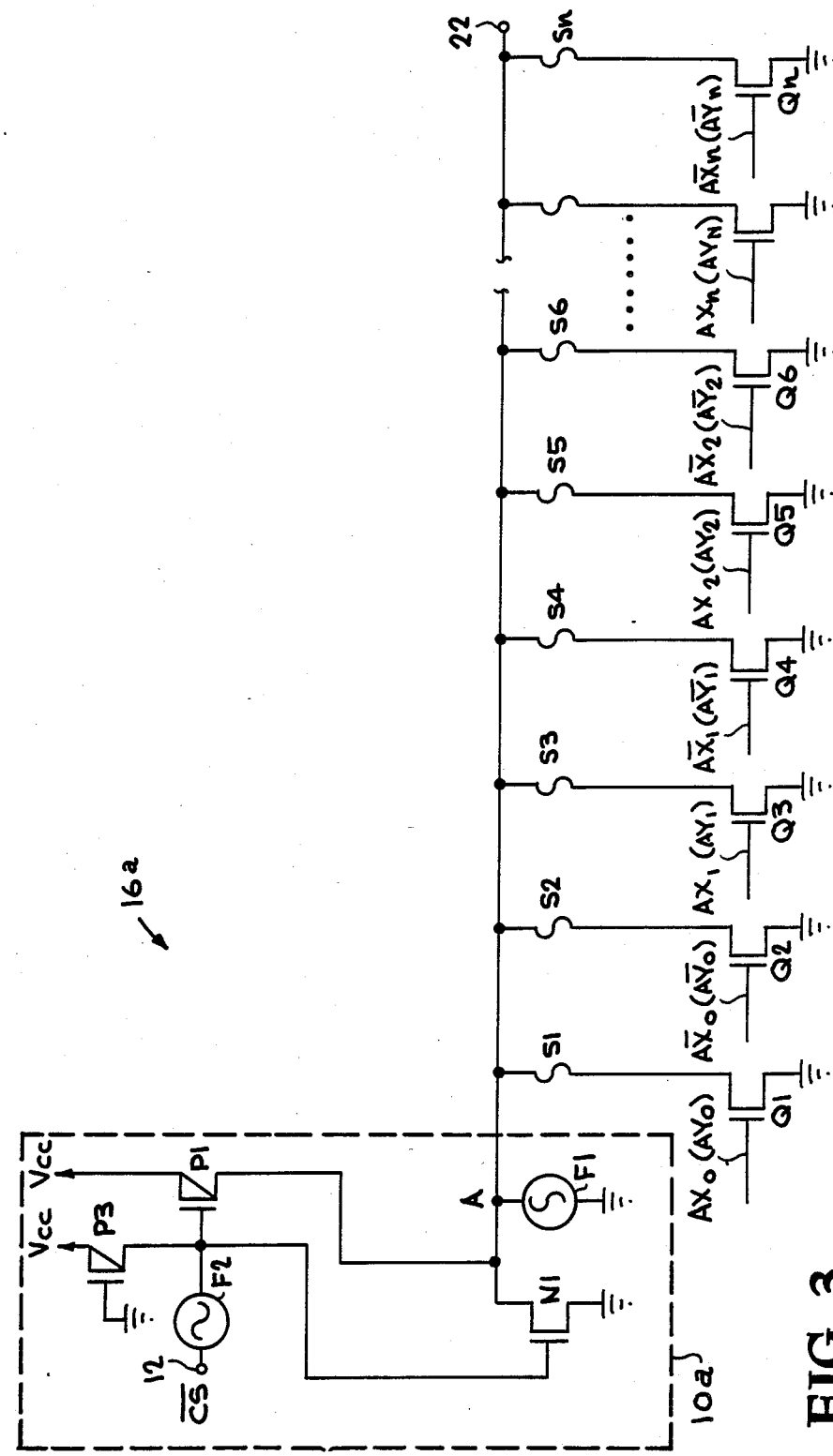
FIG. 3 is a schematic circuit diagram of a second embodiment of a redundancy enable/disable circuit of the present invention.

In FIG. 3, there is illustrated a second embodiment of a redundant enable/disable circuit 10a of the present invention. As can be seen, the circuit 10a is quite similar to the circuit 10 of FIG. 2, except that it is even simpler in its construction due to the elimination of the second P-channel MOS transistor P2. Except for this change, the circuit 10a of FIG. 5 contains the same identical components as the circuit 10 of FIG. 2. Thus, a detailed discussion of the interconnection of the various components will not be repeated. Further, the circuit 10a operates substantially in the same way as the circuit 10 in response to the complement of the chip select signal CS and does not require use of the precharging pulse $\overline{\phi}_{PC}$. It should also be noted that the dynamic latch portion 18 of FIG. 2 has been eliminated. Therefore, the redundancy decoder circuit 16a of FIG. 5 is formed with even a fewer number of circuit components than the one of the FIG. 2.

From the foregoing detailed description, it can thus been seen that the present invention provides a redundancy enable/disable circuit for enabling and disabling subsequently the use of redundant elements which includes a first fuse which is blown so as to enable redundant elements and a second fuse which is blown so as to disable the redundant elements. Further, the redundancy enable/disable circuit of the present invention is formed with a minimal number of circuit components without requiring the use of an inverter, does not involve a complicated timing scheme, and is fabricated with a compact design layout.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A redundancy enable/disable circuit for enabling and disabling subsequently the use of redundant elements comprising:
   a first P-channel MOS transistor having its source connected to a supply potential;
   a second P-channel MOS transistor having its source connected to the drain of said first P-channel transistor, its gate connected to a first input terminal, and its drain connected to an output node;
   a third P-channel MOS transistor having its source connected to the supply potential, its gate connected to a ground potential, and its drain connected to the gate of said first P-channel transistor;
   an N-channel MOS transistor having its drain connected to the drain of said second P-channel transistor, its gate connected to the gate of said first P-channel transistor, and its source connected to the ground potential;

enable fuse having a first end connected to the drain of said N-channel transistor and a second end connected to the ground potential;

a disable fuse having a first end connected to the gate of said first P-channel transistor and a second end connected to a second input terminal; and said output node being in a low logic level when said enable and disable fuses are not blown or opened, said output node being enabled when said enable fuse is blown so as to permit use of redundant elements connectible to said output node, said output node being disabled when said disable fuse is subsequently blown so as to prevent use of the redundant elements.

2. A redundancy enable/disable circuit as claimed in claim 1, wherein said enable fuse is formed of a polysilicon material, silicide or metal.

3. A redundancy enable/disable circuit as claimed in claim 2, wherein said enable fuse is blown by a laser cut.

4. A redundancy enable/disable circuit as claimed in claim 1, wherein said disable fuse is formed of a polysilicon material silicide or metal.

5. A redundancy enable/disable circuit as claimed in claim 4, wherein said disable fuse is blown by a laser cut.

6. A redundancy enable/disable circuit as claimed in claim 1, wherein said second input terminal receives a chip select signal and said first input terminal receives a precharging pulse signal.

7. A redundancy enable/disable circuit as claimed in claim 1, further comprising an address buffer means coupled to the output node for activating the redundant elements in response to true and complement address signals.

8. A redundancy enable/disable circuit for enabling and disabling subsequently the use of redundant elements comprising:

a first P-channel MOS transistor having its source connected to a supply potential and its drain connected to an output node;

a second P-channel MOS transistor having its source connected to the supply potential, its gate connected to a ground potential, and its drain connected to the gate of said first P-channel transistor;

an N-channel MOS transistor having its drain connected to the drain of said first P-channel transistor, its gate connected to the gate of said first P-channel transistor, and its source connected to the ground potential;

an enable fuse having a first end connected to the drain of said N-channel transistor and a second end connected to the ground potential;

a disable fuse having a first end connected to the gate of said first P-channel transistor and a second end connected to an input terminal; and said output node being in a low logic level when said enable and disable fuses are not blown or opened, said output node being enabled when said enable fuse is blown so as to permit use of redundant elements connectible to said output node, said output node being disabled when said disable fuse is subsequently blown so as to prevent use of the redundant elements.

9. A redundancy enable/disable circuit as claimed in claim 8 wherein said enable fuse is formed of a polysilicon material, silicide or metal.

10. A redundancy enable/disable circuit as claimed in claim 9, wherein said enable fuse is blown by a laser cut.

11. A redundancy enable/disable circuit as claimed in claim 8, wherein said disable fuse is formed of a polysilicon material, silicide or metal.

12. A redundancy enable/disable circuit as claimed in claim 11, wherein said disable fuse is blown by a laser cut.

13. A redundancy enable/disable circuit as claimed in claim 8, wherein said input terminal receives a chip select signal.

14. A redundancy enable/disable circuit as claimed in claim 8, further comprising an address buffer means coupled to the output node for activating the redundant elements in response to true and complement address signals.

* * * * *